US010192987B2

(12) United States Patent
Chang et al.

(10) Patent No.: US 10,192,987 B2
(45) Date of Patent: Jan. 29, 2019

(54) FIN-TYPE FIELD EFFECT TRANSISTOR STRUCTURE AND MANUFACTURING METHOD THEREOF

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/665,395

(22) Filed: Jul. 31, 2017

(65) Prior Publication Data
US 2017/0358678 A1    Dec. 14, 2017

Related U.S. Application Data

(63) Continuation of application No. 14/883,636, filed on Oct. 15, 2015, now Pat. No. 9,722,079.

(51) Int. Cl.
| | | |
|---|---|---|
| *H01L 29/786* | (2006.01) | |
| *H01L 29/78* | (2006.01) | |
| *H01L 29/10* | (2006.01) | |
| *H01L 29/66* | (2006.01) | |

(52) U.S. Cl.
CPC ...... *H01L 29/7848* (2013.01); *H01L 29/1083* (2013.01); *H01L 29/66537* (2013.01); *H01L 29/66636* (2013.01); *H01L 29/66795* (2013.01); *H01L 29/785* (2013.01)

(58) Field of Classification Search
CPC ............ H01L 29/7848; H01L 29/1083; H01L 29/66636; H01L 29/66795; H01L 29/66537; H01L 29/785
See application file for complete search history.

(56) References Cited

U.S. PATENT DOCUMENTS

| | | | |
|---|---|---|---|
| 9,275,905 B1* | 3/2016 | Wen | H01L 21/845 |
| 2013/0221447 A1* | 8/2013 | Lee | H01L 27/092 |
| | | | 257/369 |
| 2014/0042500 A1* | 2/2014 | Wann | H01L 29/41791 |
| | | | 257/288 |
| 2015/0048453 A1 | 2/2015 | Ching et al. | |
| 2016/0064483 A1* | 3/2016 | Kelly | H01L 29/0847 |
| | | | 257/401 |
| 2016/0322462 A1* | 11/2016 | Chou | H01L 21/30604 |

OTHER PUBLICATIONS

"Office Action of China Counterpart Application", dated Nov. 30, 2018, p. 1-p. 7.

* cited by examiner

*Primary Examiner* — Victor A Mandala
(74) *Attorney, Agent, or Firm* — JCIPRNET

(57) ABSTRACT

A fin-type field effect transistor comprising a substrate, a plurality of insulators, at least one gate stack and strained material portions is described. The substrate has a plurality of fins thereon and the fin comprises a stop layer embedded therein. The plurality of insulators is disposed on the substrate and between the plurality of fins. The at least one gate stack is disposed over the plurality of fins and on the plurality of insulators. The strained material portions are disposed on two opposite sides of the at least one gate stack.

20 Claims, 13 Drawing Sheets

FIN-TYPE FIELD EFFECT TRANSISTOR STRUCTURE AND MANUFACTURING METHOD THEREOF

CROSS-REFERENCE

This application is a continuation application of and claims the priority benefit of U.S. patent application Ser. No. 14/883,636, filed Oct. 15, 2015 and now pending. The entirety of the above-mentioned patent applications is hereby incorporated by reference herein and made a part of this specification.

BACKGROUND

As the semiconductor devices keep scaling down in size, three-dimensional multi-gate structures, such as the fin-type field effect transistor (FinFET), have been developed to replace planar CMOS devices. A structural feature of the FinFET is the silicon-based fin that extends upright from the surface of the substrate, and the gate wrapping around the channel further provides better electrical control over the channel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
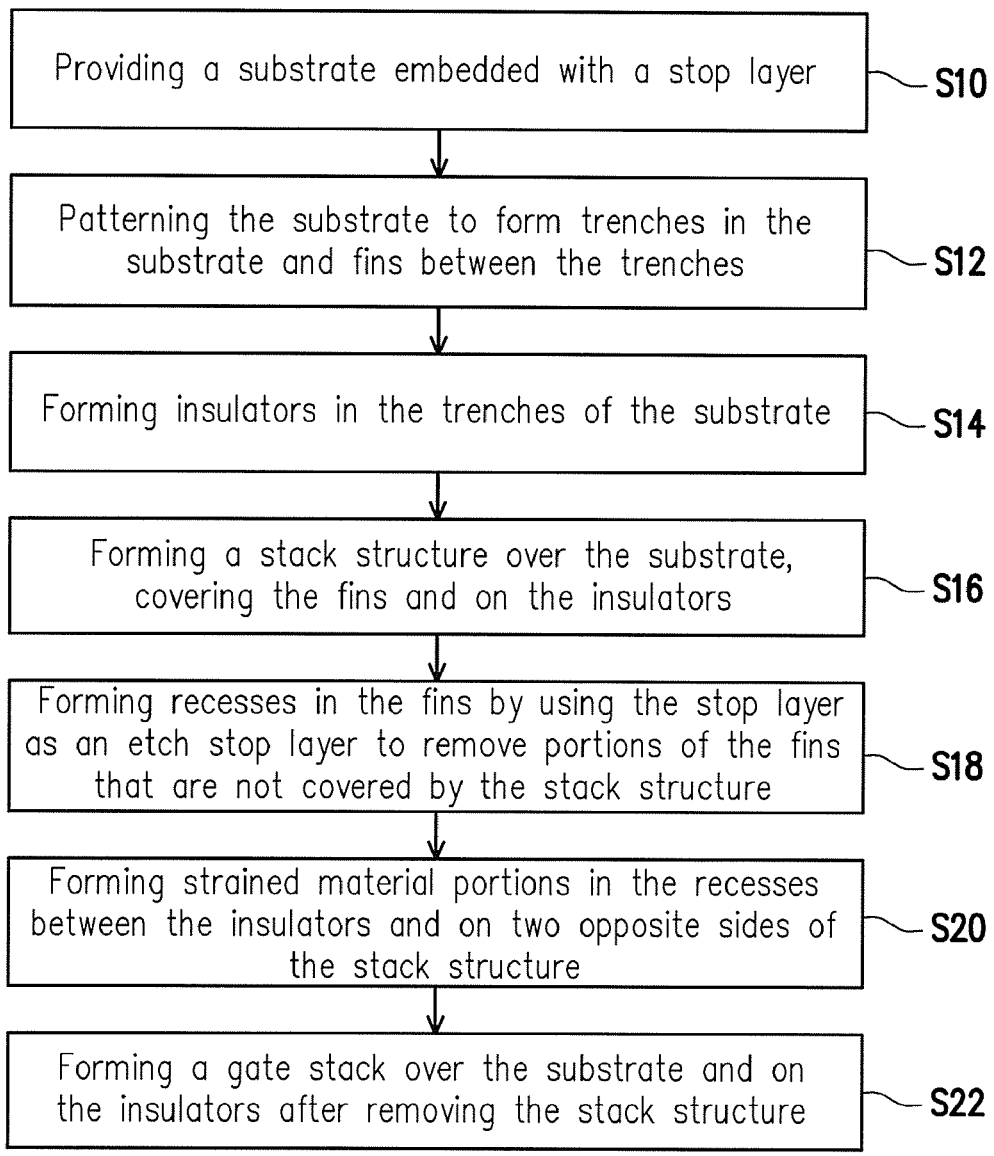
FIG. 1 is an exemplary flow chart showing the process steps of the manufacturing method for forming a FinFET in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary manufacturing processes of FinFETs and the FinFETs fabricated there-from. The FinFET may be formed on bulk silicon substrates in certain embodiments of the present disclosure. Still, the FinFET may be formed on a silicon-on-insulator (SOI) substrate or a germanium-on-insulator (GOI) substrate as alternatives. Also, in accordance with the embodiments, the silicon substrate may include other conductive layers or other semiconductor elements, such as transistors, diodes or the like. The embodiments are not used to limit the contexts.

In accordance with the embodiments, FIG. 1 is an exemplary flow chart showing the process steps of the manufacturing method for forming a FinFET. The various process steps of the process flow illustrated in FIG. 1 may comprise multiple process steps as discussed below. FIGS. 2A-3G are the perspective views and cross-sectional views showing the FinFET at various stages of the manufacturing method for forming the FinFET according to some embodiments of the present disclosure. It is to be noted that the process steps described herein cover a portion of the manufacturing processes used to fabricate a FinFET device.

Figure 2A:
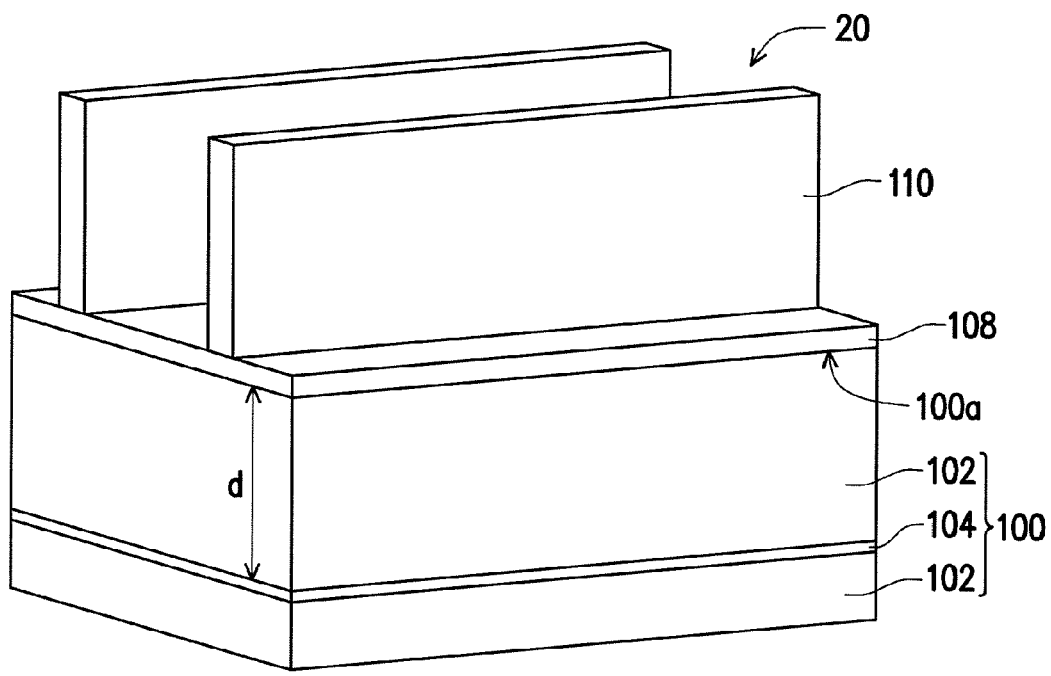
FIGS. 2A-3G are the perspective views and cross-sectional views showing the FinFET at various stages of the manufacturing method for forming a FinFET according to some embodiments of the present disclosure.
Figure 3A:
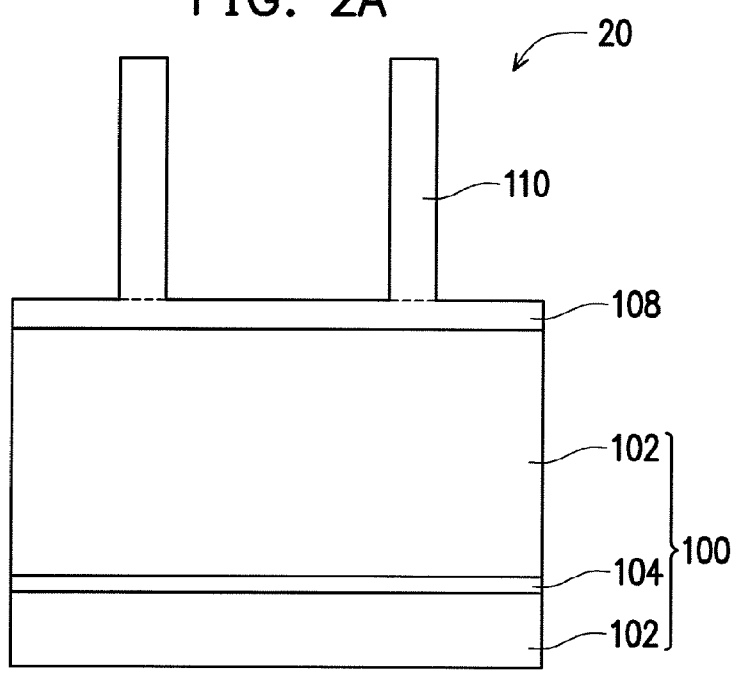

FIG. 2A is a perspective view of the FinFET 20 at one of various stages of the manufacturing method, and FIG. 3A is a cross-sectional view of the FinFET 20 taken along the line I-I' of FIG. 2A. In Step 10 and as shown in FIGS. 2A & 3A, a substrate 100 embedded with a stop layer 104 is provided. Then, a mask layer 108 is formed over the substrate 100 and a photo-sensitive pattern 110 is formed on the mask layer 108 and over the substrate 100. In one embodiment, the mask layer 108 is a silicon nitride layer formed by, for example, chemical vapor deposition (CVD). In some embodiments, the substrate 100 is a bulk silicon substrate 102 having a stop layer 104 embedded therein. Depending on the requirements of design, the bulk silicon substrate 102 may be a p-type substrate or an n-type substrate and comprise different doped regions. The doped regions may be configured for an n-type FinFET or a p-type FinFET. In some embodiments, the material of the stop layer 104 includes silicon germanium oxide (SiGeOx), silicon germanium (SiGe), silicon oxide (SiOx), silicon phosphide (SiP), silicon phosphate (SiPOx), or the combination thereof, wherein x is larger than zero (x>0). In some embodiments, the stop layer 104 has a thickness ranging from 1 nm to 50 nm, for example. In some embodiments, the substrate 100 is formed by providing the bulk silicon substrate 102 and then forming the stop layer 104 embedded within the bulk silicon substrate 102 by ion implantation. The implantation dosage and/or the implantation energy of the ion implantation may be chosen in order to form the stop layer 104 at the desirable location in the bulk silicon substrate 102. That is, the depth and the thickness of the stop layer 104 may be varied depending on the conditions of the ion implantation. The material of the stop layer 104 is controlled by the type(s) of the dopants used in the ion implantation.

Alternatively, in another embodiment as shown in FIG. 3A', the substrate 100 is formed by providing a bulk silicon substrate 102A, forming a stop layer 104 on the bulk silicon substrate 102A and then forming a silicon layer 102B on the stop layer 104. The stop layer 104 is sandwiched between the bulk silicon substrate 102A and the silicon layer 102B (i.e., embedded in the bulk silicon substrate 102). The bulk silicon substrate 102 in FIGS. 2A & 3A is considered as comparable or equivalent to the bulk silicon substrate 102A and the silicon layer 102B in FIG. 3A'. In some embodiments, the material of the stop layer 104 includes SiGeOx, SiGe, SiOx, SiP, SiPOx, or the combination thereof. In some embodiments, the stop layer 104 has a thickness ranging from 1 nm to 50 nm, for example. In one embodiment, the stop layer 104 is formed by atomic layer deposition (ALD) or any other suitable deposition process, for example. The thickness of the silicon layer 102B may be determined depending on the requirements of the design.

Figure 2B:
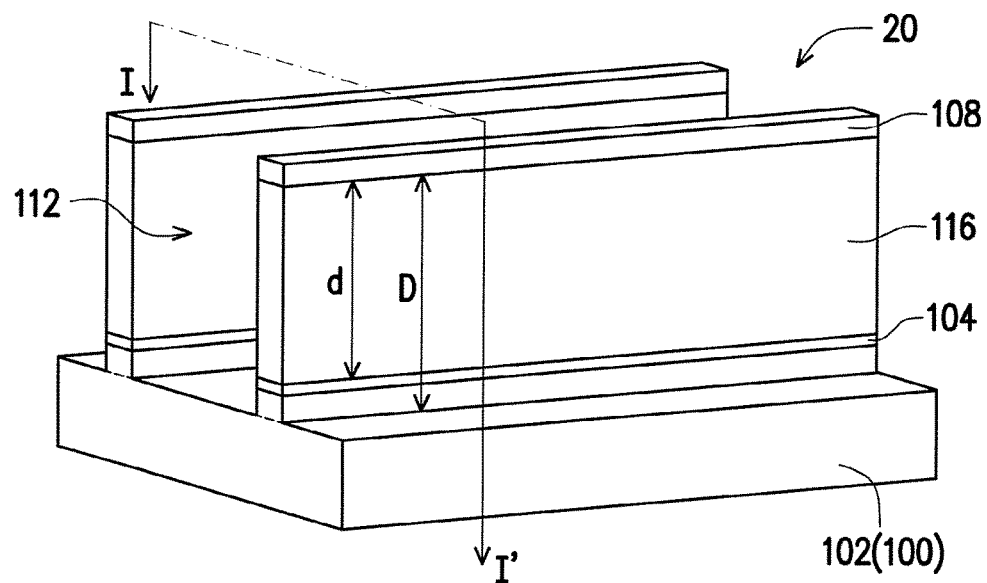
Figure 3B:
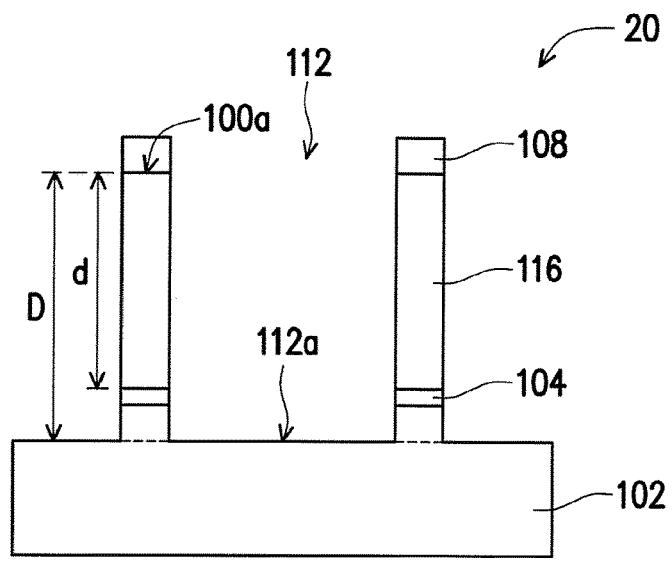

FIG. 2B is a perspective view of the FinFET 20 at one of various stages of the manufacturing method, and FIG. 3B is a cross-sectional view of the FinFET 20 taken along the line I-I' of FIG. 2B. In Step 12, as shown in FIG. 2B, the substrate 100 is patterned to form trenches 112 in the substrate 100 and the fins 116 are formed between the trenches 112 by etching into the substrate 100, using the photosensitive pattern 110 and the mask layer 108 as etching masks. In some embodiments, the trenches 112 are strip-shaped and arranged in parallel. Counting from the surface 100a of the substrate 100, the trench 112 has a depth D larger than a depth d of the stop layer 104. During the patterning of the substrate 100, the stop layer 104 is partially removed at the locations of the trenches 112, while the stop layer 104 is remained within the fins 116. That is, the fins 116 are inset with the stop layer 104, the stop layer 104 embedded in the fins 116 is located at a position higher than a bottom 112a of the trench 112.

Figure 2C:
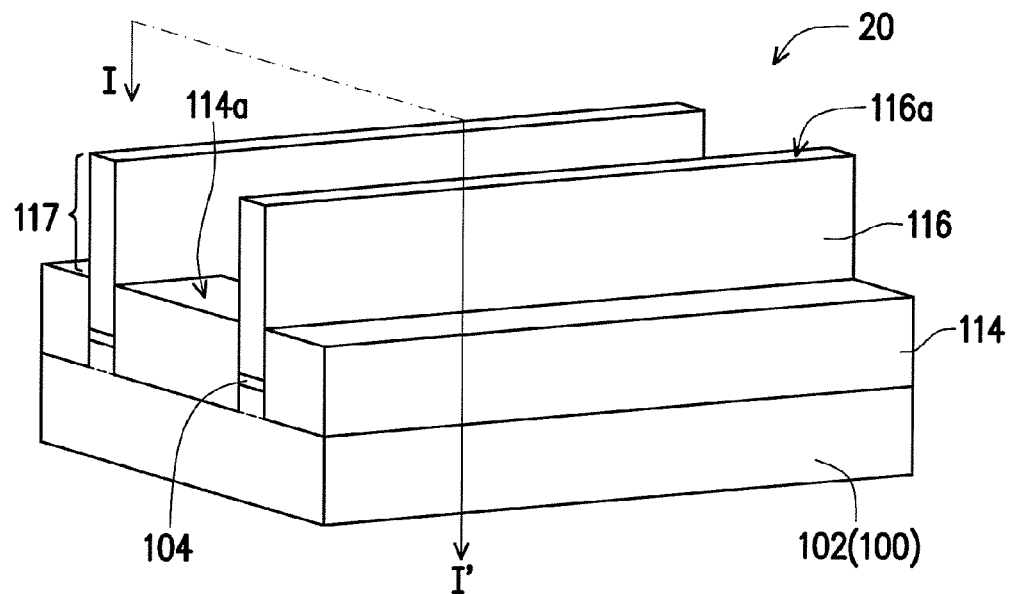
Figure 3C:
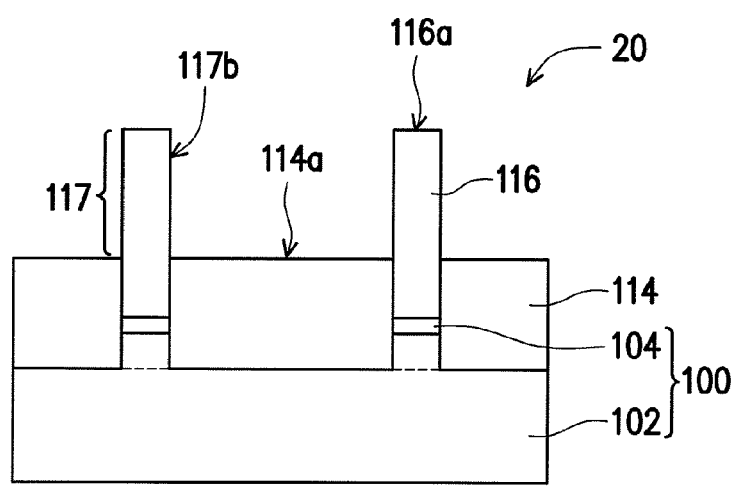

FIG. 2C is a perspective view of the FinFET 20 at one of various stages of the manufacturing method, and FIG. 3C is a cross-sectional view of the FinFET 20 taken along the line I-I' of FIG. 2C. In Step 14, insulators 114 filled within the trenches 112 are formed. The trenches 112 are filled with an insulating material (not shown). In some embodiments, the insulating material includes silicon oxide, silicon nitride, silicon oxynitride, a spin-on dielectric material, or a low-k dielectric material. The insulating material is formed by high-density-plasma chemical vapor deposition (HDP-CVD), sub-atmospheric CVD (SACVD) or by spin-on. Optionally, a chemical mechanical polish process is performed to remove the projected insulating material and the remained mask layer 108 (referring to FIG. 2B). Afterwards, the insulating material filled in the trenches 112 between the fins 116 is partially removed by an etching process. In one embodiment, the etching process is performed by using a wet etching process with hydrofluoric acid (HF). In another embodiment, the etching process is performed by using a dry etching process. The insulating material remained within the trenches 112 becomes insulators 114 with top surfaces 114a lower than the top surfaces 116a of the fins 116. Upper portions 117 of the fins 116 protrude from the top surfaces 114a of the insulators 114.

Figure 2D:
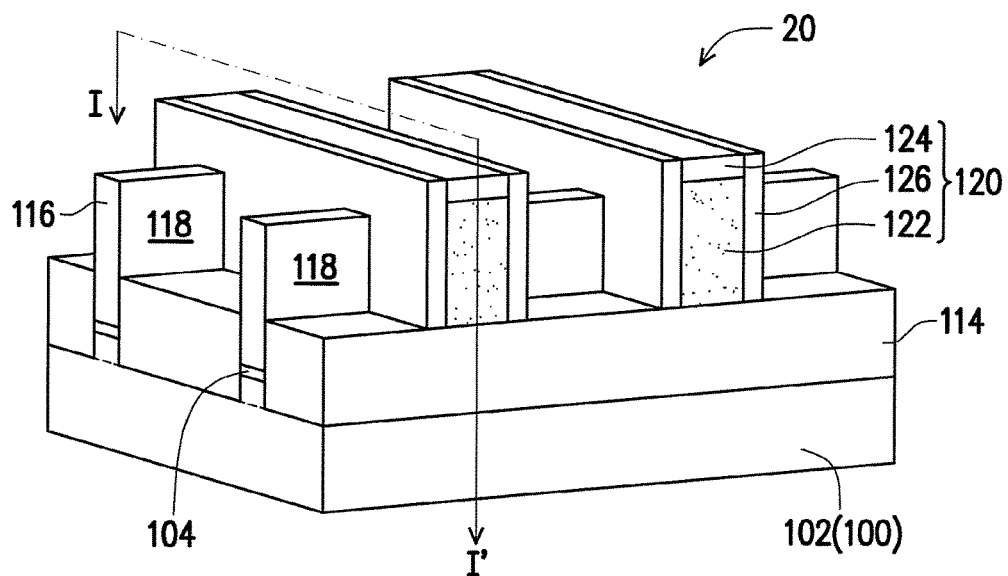
Figure 3D:
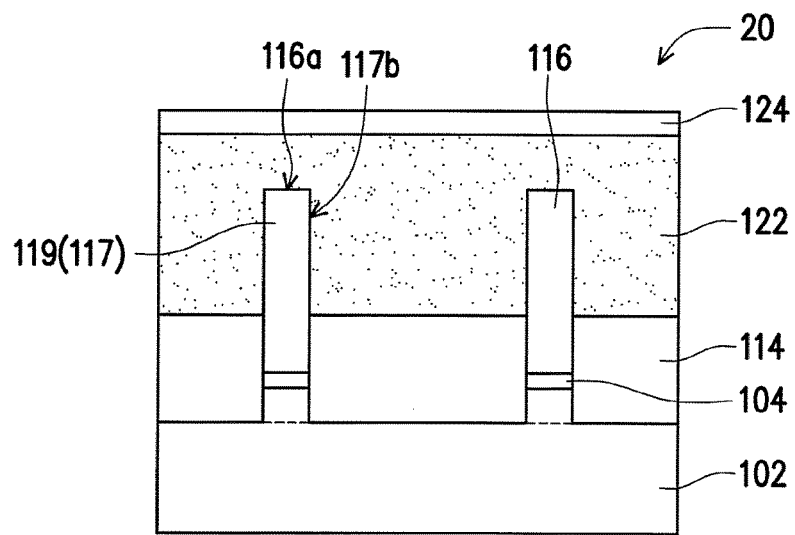

FIG. 2D is a perspective view of the FinFET 20 at one of various stages of the manufacturing method, and FIG. 3D is a cross-sectional view of the FinFET 20 taken along the line I-I' of FIG. 2D. In Step 16, a stack structure 120 is formed over the substrate 100 and on the insulators 114, and across and over the upper portions 117 of the fins 116. In FIG. 2D, two stack structures are shown, and the number of the stack structures 120 are for illustrative purposes but not intended to limit the structure of the present disclosure. The stack structures 120 are arranged in parallel. The stack structure 120 comprises a polysilicon strip 122, a hard mask strip 124 located on the polysilicon strip 122 and spacers 126 located on sidewalls of the polysilicon strip 122 and the hard mask strip 124. In at least one embodiment, one of the stack structure 120 covers the upper portions 117 of the fins 116. In some embodiments, the stack structure 120 is formed by depositing a polysilicon layer (not shown), a hard mask layer (not shown) over the polysilicon layer and then patterning the hard mask layer and the polysilicon layer to form the polysilicon strips 122 and the hard mask strips 124. Optionally, an oxide layer (not shown) is formed before forming the polysilicon layer to protect the fins 116. Then, the spacers 126 are formed on the sidewalls of the hard mask strip 124 and the polysilicon strip 122. In one embodiment, the hard mask strip 124 is formed of silicon nitride, silicon oxide or the combination thereof, for example. In some embodiments, the spacers 126 are formed of dielectric materials, such as silicon nitride, SiCON or the combination thereof. The spacers 126 may be a single layer or a multilayered structure. In some embodiments, the spacers 126 are formed by depositing a blanket layer of a dielectric material and performing an anisotropic etching process to form the spacers 126 on both sides of the stack structure 120.

As also shown in FIGS. 2D & 3D, the polysilicon strip 122 overlaps with and covers portions 119 of the upper portions 117 of the fins 116 and the covered portions 119 of the upper portions 117 of the fins 116 are used to form channel regions of the FinFET 20. Portions of the upper portions 117 of the fins 116 that are not covered by the stack structures 120 are referred to as exposed portions 118 hereinafter. The extending direction of the stack structure 120 is perpendicular to the extending direction of the fin 116.

Figure 2E:
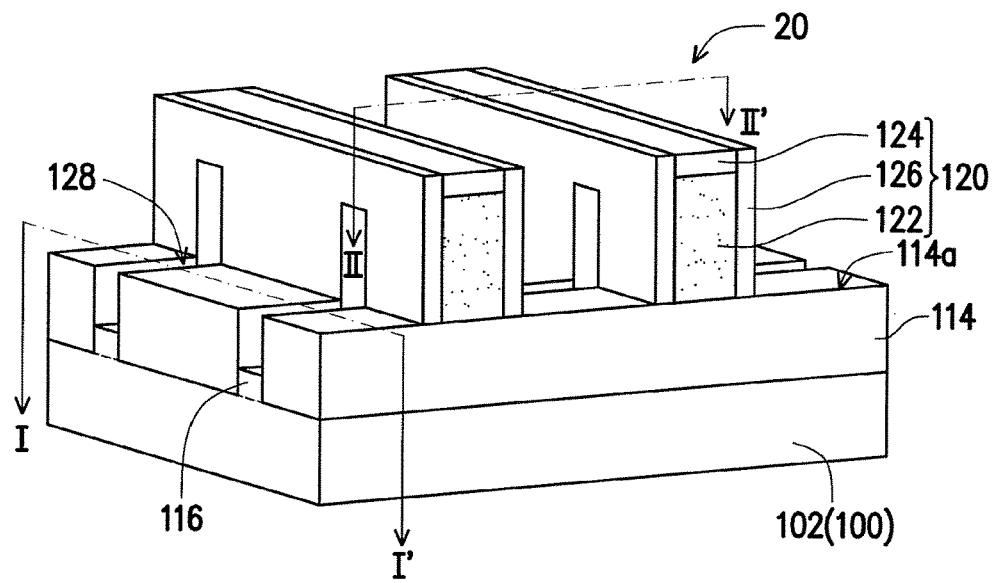
Figure 3E:
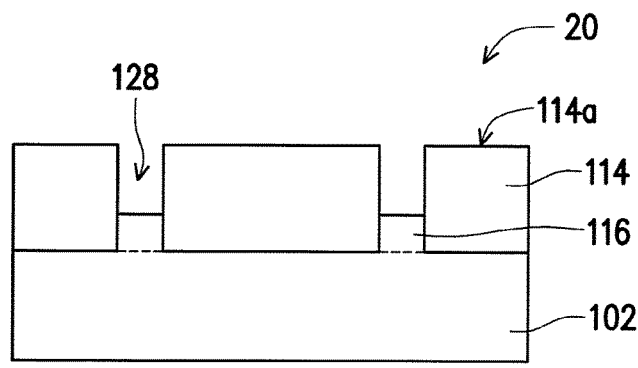

FIG. 2E is a perspective view of the FinFET 20 at one of various stages of the manufacturing method, and FIG. 3E is a cross-sectional view of the FinFET 20 taken along the line I-I' of FIG. 2E. In Step 18, the exposed portions 118 (FIG. 2D) of the fins 116 are removed to form recesses 128, for example, by using anisotropic etching, isotropic etching or the combination thereof. In some embodiments, the fins 116 are recessed below the top surface 114a of the insulators 114. In some embodiments, the etching of the exposed portions 118 of the fins 116 stops at the stop layer 104, forming recesses 128 between the insulators 114. In alternative embodiments, the etching of the exposed portions 118 of the fins 116 slightly penetrates through the stop layer 104.

FIG. 3E' is a cross-sectional view of the FinFET 20 taken along the line II-IF of FIG. 2E. Referring to FIGS. 2E and 3E', the fins 116 that are not covers by the stack structures 120 are recessed until the stop layer 104 is removed. The stop layer 104 functions as an etching stop layer during the etching process for removing the exposed portions 118 (FIG. 2D) and the profile of the recess 128 can be well controlled. In FIG. 3E', the etching process for removing the exposed portions 118 of the fins 116 to form the recesses 128 includes at least one etching process. In one embodiment, the fin 116 is etched through one anisotropic etching process until the stop layer 104 is removed. In some embodiments, by adjusting the etching conditions of the anisotropic etching process, the resultant recess 128 in the fin 116 has a depth D1 and has a substantially vertical side profile, so that the top critical dimension (the top dimension of the recess) CDt, the middle critical dimension (the middle dimension of the recess) CDm and the bottom critical dimension (the bottom dimension of the recess) CDb of the resultant recess 128 are substantially equivalent. The depth D1 of the recesses 128 is adjustable depending on the process needs.

As shown in FIG. 3E', the stop layer 104 within the fins 116 under the stack structure 120 is remained. In some embodiments, the bottom 128b of the recess 128 is substantially leveled with the stop layer 104 embedded within the fins 116.

Figure 2F:
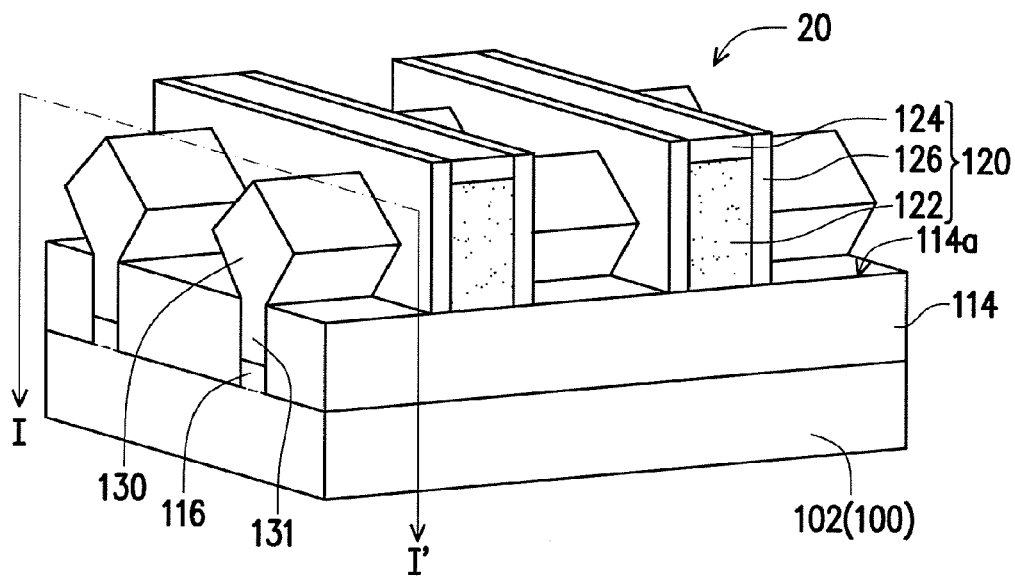
Figure 3F:
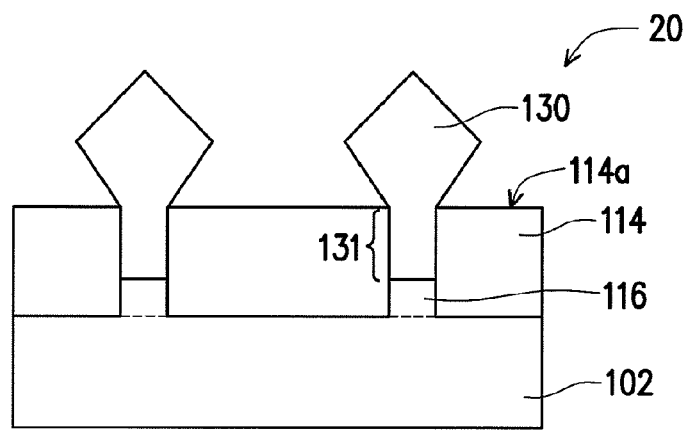

FIG. 2F is a perspective view of the FinFET 20 at one of various stages of the manufacturing method, and FIG. 3F is a cross-sectional view of the FinFET 20 taken along the line I-I' of FIG. 2F. In Step 20, strained material portions 130 are formed in the recesses 128 between the insulators 114 by forming a strained material (not shown) filled into the recesses 128. The strained material portions 130 are located on opposite sides of the stack structure 120. In some embodiments, the material of the strained material portions 130 comprise SiGe, silicon carbon (SiC) or SiP, for example. In some embodiments, the strained material portions 130 are formed by selectively growing epitaxy. After the recesses 128 are filled with the strained material, further epitaxial growth of the strained material causes the strained material portions 130 to expand upward and horizontally beyond the recesses 128 and above the insulators 114. Since the lattice constant of the strained material is different from the material of the substrate 100, the channel region is strained or stressed to increase carrier mobility of the device and enhance the device performance. In some embodiments, some of the strained material portions 130 are formed with facets and portions 131 of the strained material portions 130 below the top surfaces 114a of the insulators 114 are referred as the base portions 131. Then, the strained material portions 130 are implanted to form source and drain regions (labelled as 130 as well). The source and drain regions 130, also called strained source and drain regions, are located on opposite sides of the stack structure 120. In some embodiments, the source and drain regions 130 are optionally formed with silicide top layers (not shown) by silicidation.

Figure 2G:
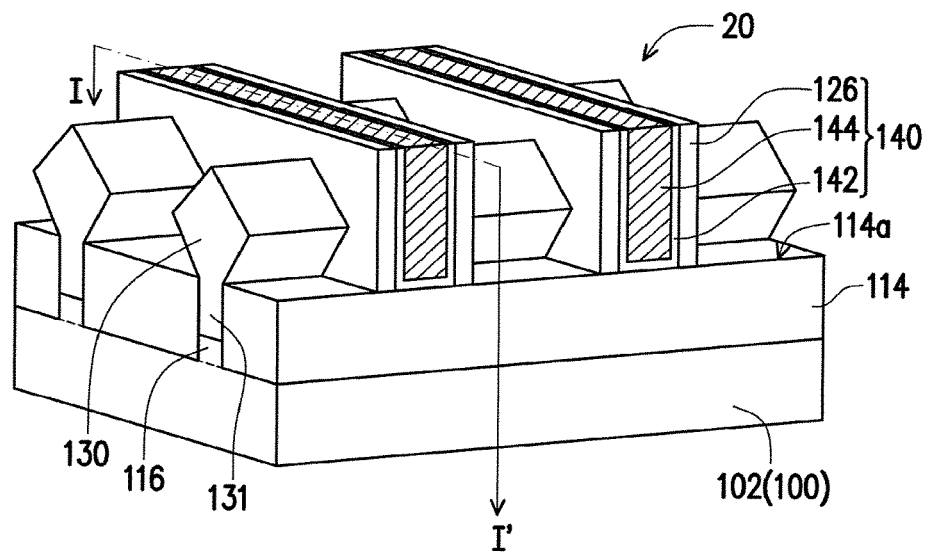
Figure 3G:
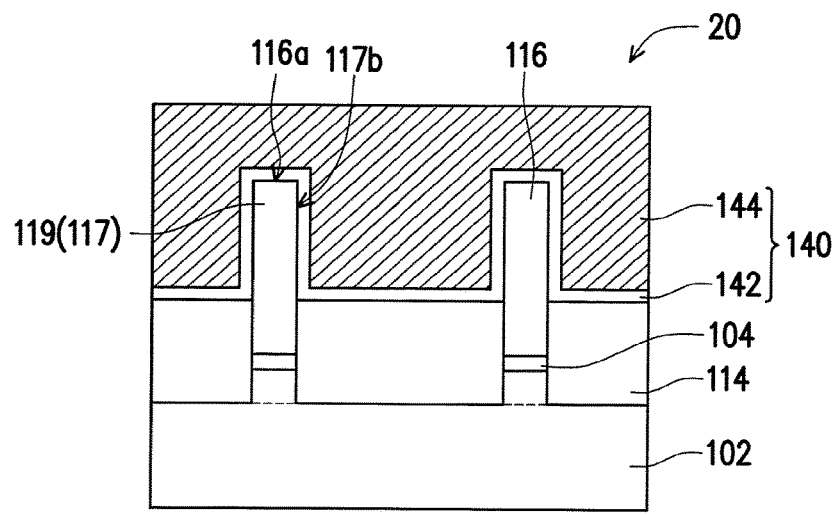
Figure 3A:
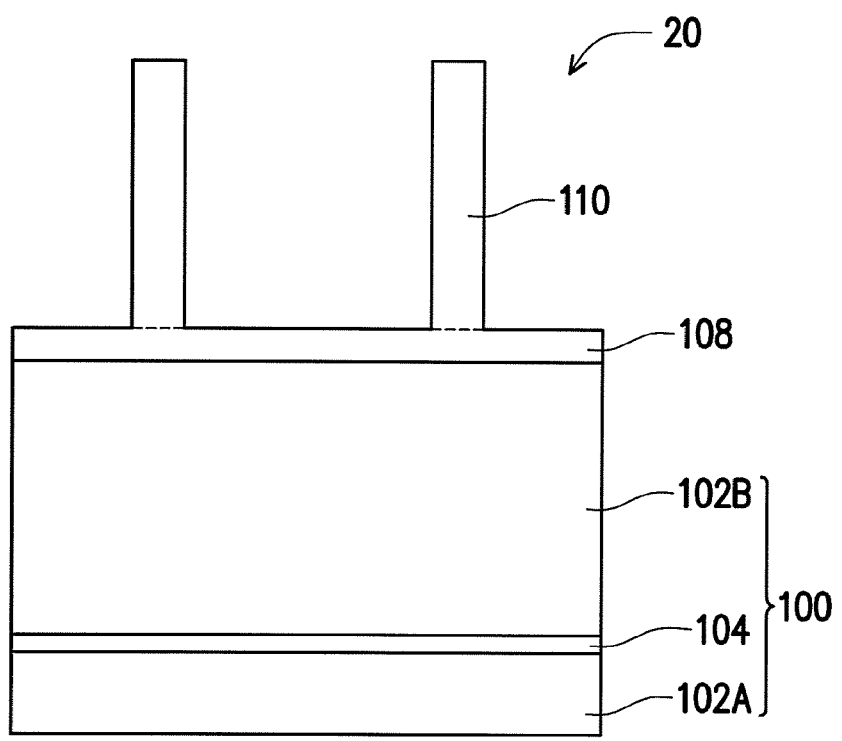
Figure 3E:
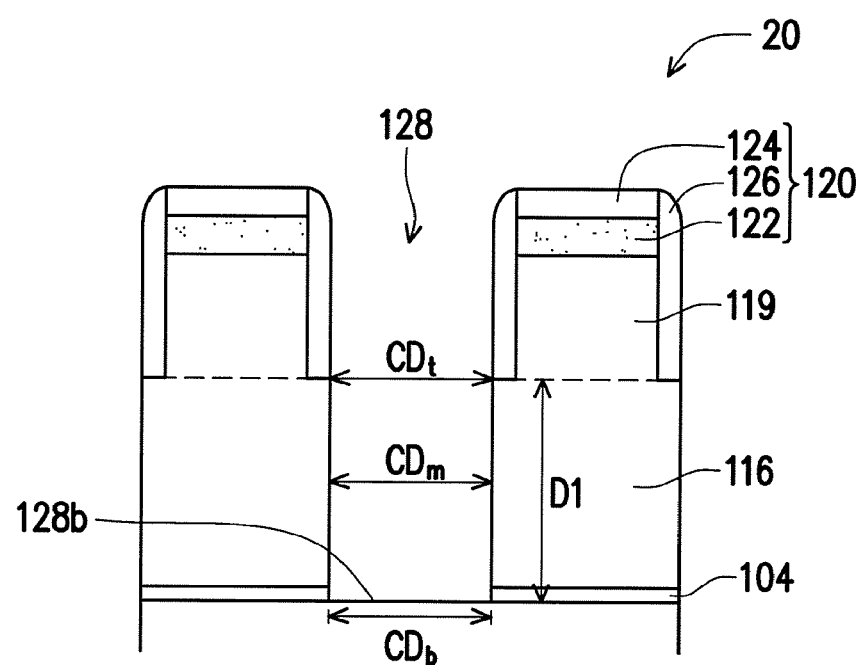

FIG. 2G is a perspective view of the FinFET 20 at one of various stages of the manufacturing method, and FIG. 3G is a cross-sectional view of the FinFET 20 taken along the line IT of FIG. 2G. In Step 22, the gate stack 140 is formed, after removing the stack structure 120. In one embodiment, the polysilicon strips 122 and the hard mask strips 124 located on the polysilicon strips 122 are removed by anisotropic etching and the spacers 126 are remained. Then, a gate dielectric layer 142 is formed within the recesses between the spacers 126 and on the top surfaces 116a and the sidewalls 117b of the fins 116. In some embodiments, the material of the gate dielectric layer 142 comprises silicon oxide, silicon nitride or the combination thereof. In some embodiments, the gate dielectric layer 142 comprises a high-k dielectric material, and the high-k dielectric material has a k value greater than about 7.0 and includes a metal oxide or a silicate of Hf, Al, Zr, La, Mg, Ba, Ti, Pb and combinations thereof. In some embodiments, the gate dielectric layer 142 is formed by ALD, molecular beam deposition (MBD), physical vapor deposition (PVD) or thermal oxidation. Then, a gate electrode layer 144 is formed over the gate dielectric layer 142, over the covered portions 119 (the channel regions) and fills the remaining recesses between the spacers 130. In some embodiments, the gate electrode layer 144 comprises a metal-containing material, such as Al, Cu, W, Co, Ti, Ta, Ru, TiN, TiAl, TiAlN, TaN, TaC, NiSi, CoSi or a combination thereof. Depending on whether the FinFET 20 is a p-type FinFET or an n-type FinFET, the materials of the gate dielectric layer 142 and/or the gate electrode layer are chosen. Optionally, a CMP process is performed to remove the excess portions of gate dielectric layer 142 and the gate electrode layer 144. The spacers 126 are located on sidewalls of the gate dielectric layer 142 and the gate electrode layer 144. That is, the stack structures 120 are replaced and the replacement gate stacks 140 are formed. In some embodiments described herein, the gate stacks 140 are replacement gates, but the gate stack structures or the fabrication processes thereof are not limited by these embodiments.

In some embodiments, the gate stacks 140 are located on the insulators 114 and the source and drain regions 130 are located on two opposite sides of the gate stacks 140. The gate stack 140 covers the channel regions 119 of the fins 116, and the resultant FinFET 20 includes a plurality of fins.

FIGS. 4A-4E are cross-sectional views showing FinFET fabricated with different etching processes according to embodiments of the present disclosure. In some embodiments, the stop layer 104 functions as an etching stop layer during the etching process for removing the exposed portions 118 and the profile of the recess 128 can be well controlled. In some embodiments, the etching stops at the etching stop layer, and the etching stop layer is removed.

Figure 4A:
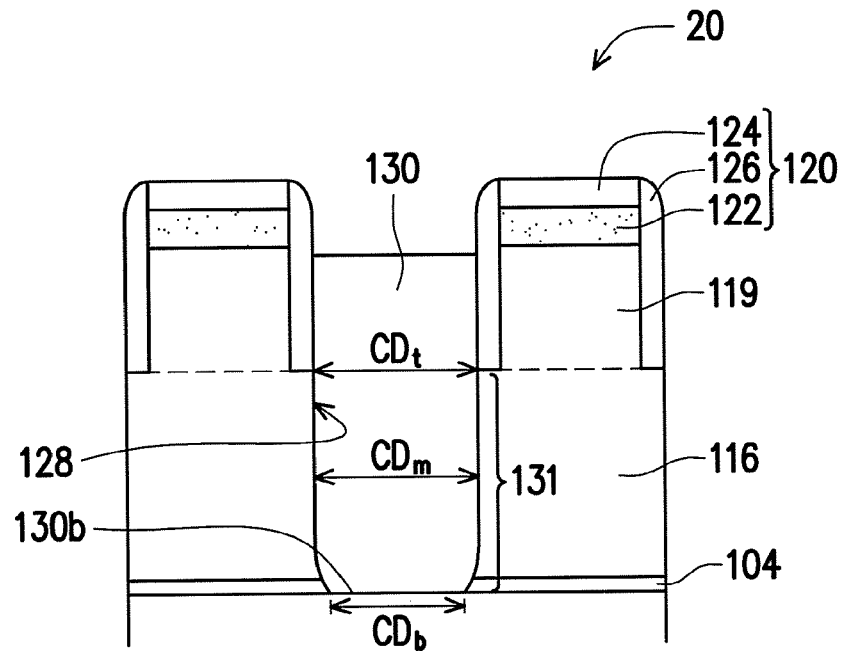
FIGS. 4A-4E are cross-sectional views showing FinFETs fabricated with different etching processes according to some embodiments of the present disclosure.

In one embodiment, as shown in FIG. 4A, the fin 116 not covered by the stack structure 120 is etched and the etching stops at the stop layer 104. The etching process for removing the fins 116 to form the recesses 128 includes a first etching process and a second etching process, while the first etching process includes an anisotropic etching process and the second etching process includes an isotropic etching process. In some embodiments, the fin 116 is etched through the anisotropic etching process until half or more of the depth of the recess 128 is reached and then is further etched through the isotropic etching process and the stop layer 104 is removed. By adjusting the etching conditions and etching selectivity of the anisotropic etching process and the isotropic etching process, the side profile of the resultant recess 128 is well controlled and the recess 128 has a narrow-base profile (i.e., the bottom of the recess 128 is smaller than the opening of the recess 128), so that the top critical dimension CDt of the resultant recess 128 is substantially equivalent to the middle critical dimension CDm of the resultant recess 128 and is larger than the bottom critical dimension CDb of the resultant recess 128. Later, the strained material portion 130 is formed in the recess 128 and fills up the recess 128. Regarding the strained material portion 130 filled within the recess 128 (i.e., the base portion 131 of the strained material portion 130 below the top surface 114a of the insulators 114), the top dimension CDt of the base portion 131 is substantially equivalent to the middle critical dimension CDm of the base portion 131 and is larger than the bottom critical dimension CDb of the base portion 131 of the strained material portion 130. In some embodiments, the bottom 130b of the strained material portion 130 is substantially leveled with the stop layer 104 embedded within the fins 116.

Figure 4B:
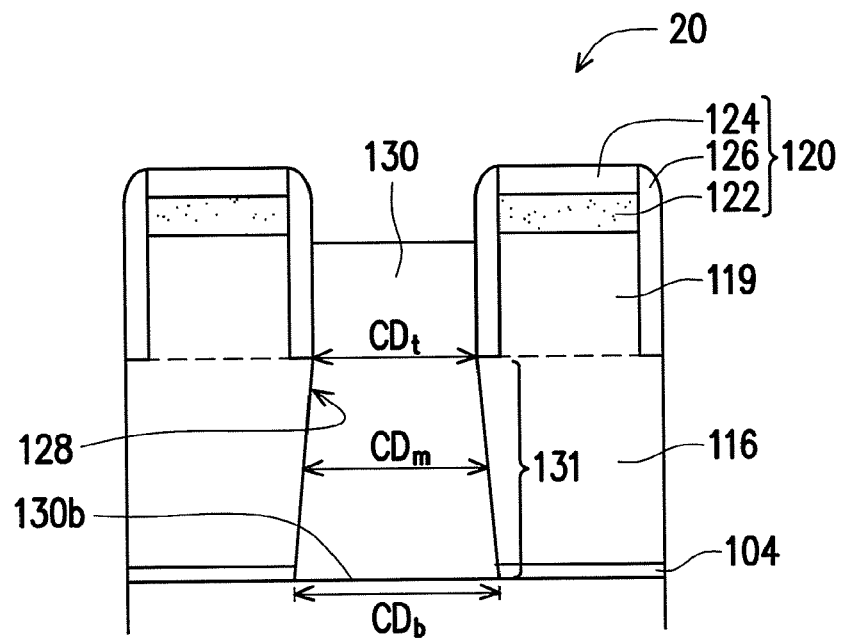

In one embodiment, as shown in FIG. 4B, the fin 116 not covered by the stack structure 120 is recessed using the stop layer 104 as an etching stop layer. The etching process for removing the fins 116 to form the recesses 128 includes a first etching process and a second etching process, while the first etching process includes a main etching process and the second etching process includes a lateral etching process. In some embodiments, the fin 116 is etched through the main anisotropic etching process until half or more of the depth of the recess 128 is reached and then is further etched through the lateral etching process and the stop layer 104 is removed. The lateral etching process further widens the recess 128. By adjusting the etching conditions and etching selectivity of the main anisotropic etching process and the lateral etching process, the side profile of the resultant recess 128 is well controlled and the recess 128 has a wide-base profile that is ascendingly sloped (i.e., the recess 128 becomes larger from the opening to the bottom of the recess 128), so that the top critical dimension CDt is smaller than the middle critical dimension CDm and the middle critical dimension CDm is smaller than the bottom critical dimension CDb of the resultant recess 128. Later, the strained material portion 130 is formed in the recess 128 and fills up the recess 128. Regarding the base portion 131 of the strained material portion 130 below the top surface 114a of the insulators 114, the top dimension CDt of the base portion 131 is smaller than the middle critical dimension CDm of the base portion 131 and the middle critical dimension CDm of the base portion 131 is smaller than the bottom critical dimension CDb of the base portion 131 of the strained material portion 130. In some embodiments, the bottom 130b of the strained material portion 130 is substantially leveled with the stop layer 104 embedded within the fins 116.

Figure 4C:
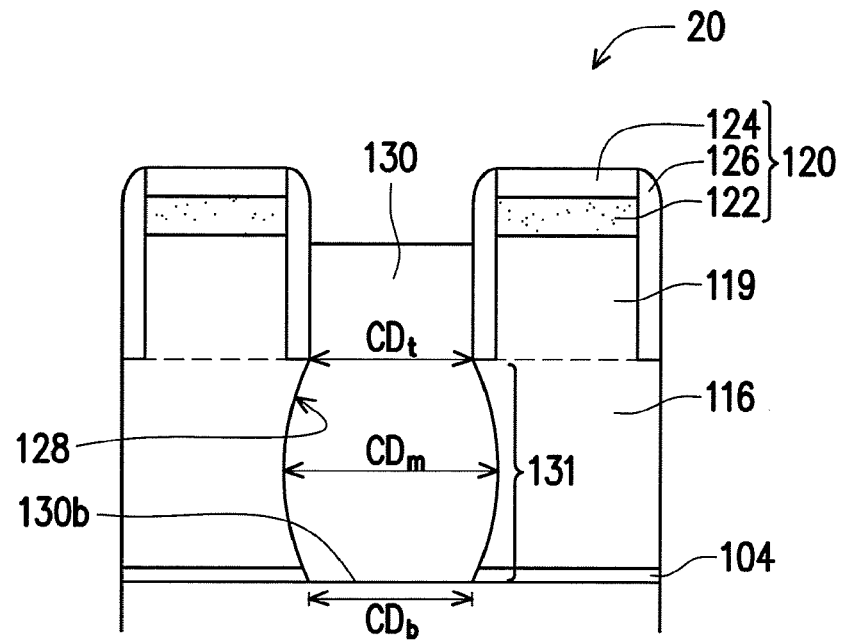

In one embodiment, as shown in FIG. 4C, the fin 116 not covered by the stack structure 120 is recessed using the stop layer 104 as an etching stop layer. The etching process for removing the fins 116 to form the recesses 128 includes a first etching process and a second etching process, while the first etching process includes an isotropic etching process and the second etching process includes an anisotropic etching process. In some embodiments, the fin 116 is etched through the isotropic etching process until half or more of the depth of the recess 128 is reached and then is further etched through the anisotropic etching process and the stop layer 104 is removed. The lateral isotropic etching process widens the recess 128 and the anisotropic etching process deepens the recess 128. By adjusting the etching conditions and etching selectivity of the isotropic etching process and the anisotropic etching process, the side profile of the resultant recess 128 is well controlled and the recess 128 has a wide-middle profile, so that the top critical dimension CDt is substantial equivalent to the bottom critical dimension CDb and is smaller than the middle critical dimension CDm of the resultant recess 128. Later, the strained material portion 130 is formed in the recess 128 and fills up the recess 128. Regarding the base portion 131 of the strained material portion 130 below the top surface 114a of the insulators 114, the top dimension CDt of the base portion 131 is substantially equivalent to the bottom critical dimension CDb of the base portion 131 and is smaller than the middle critical dimension CDm of the base portion 131 of the strained material portion 130. In some embodiments, the bottom 130b of the strained material portion 130 is substantially leveled with the stop layer 104 embedded within the fins 116.

Figure 4D:
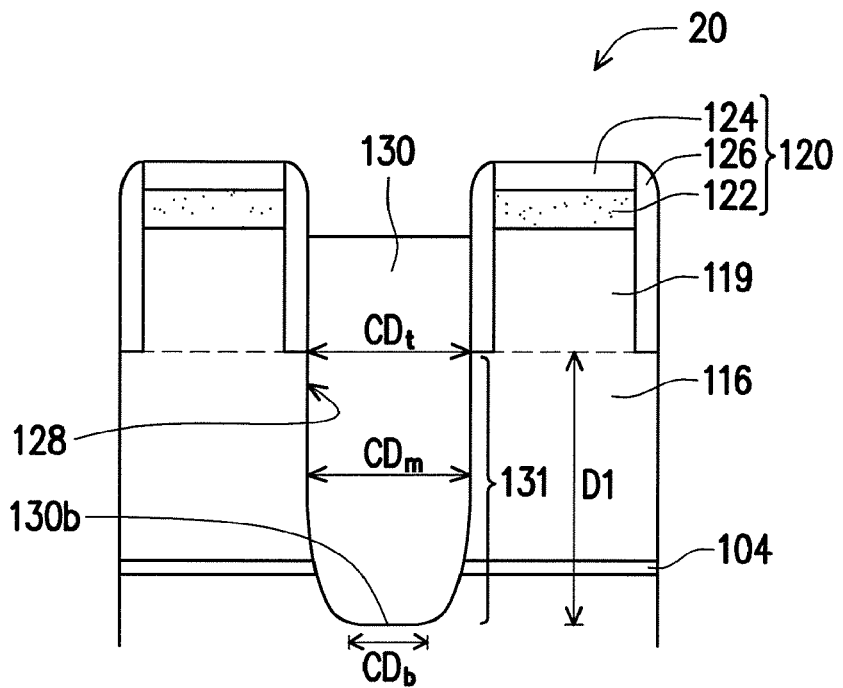

In one embodiment, as shown in FIG. 4D, the fin 116 not covered by the stack structure 120 is recessed through the stop layer 104. The etching of the fins 116 continues until penetrating through the stop layer 104, but the depth D1 of the recess 128 is smaller than the depth D (FIG. 2B) of the fins 116. The etching process for removing the fins 116 to form the recesses 128 includes a first etching process and a second etching process, while the first etching process includes a main anisotropic etching process and the second etching process includes an isotropic etching process. In some embodiments, the fin 116 is etched through the main anisotropic etching process until the stop layer is penetrated through and then is over-etched through the isotropic etching process. By adjusting the etching conditions and etching selectivity of the anisotropic etching process and the isotropic etching process, the depth and the side profile of the resultant recess 128 are well controlled and the recess 128 has a narrow-base profile, so that the top critical dimension CDt is substantial equivalent to the middle critical dimension CDm and is larger than the bottom critical dimension CDb of the resultant recess 128. Later, the strained material portion 130 is formed in the recess 128 and fills up the recess 128. For the base portion 131 of the strained material portion 130 below the top surface 114a of the insulators 114, the top dimension CDt of the base portion 131 is substantial equivalent to the middle critical dimension CDm of the base portion 131 and the middle critical dimension CDm of the base portion 131 is larger than the bottom critical dimension CDb of the base portion 131 of the strained material portion 130. In some embodiments, the stop layer 104 embedded within the fins 116 is located above the bottom 130b of the strained material portion 130.

Figure 4E:
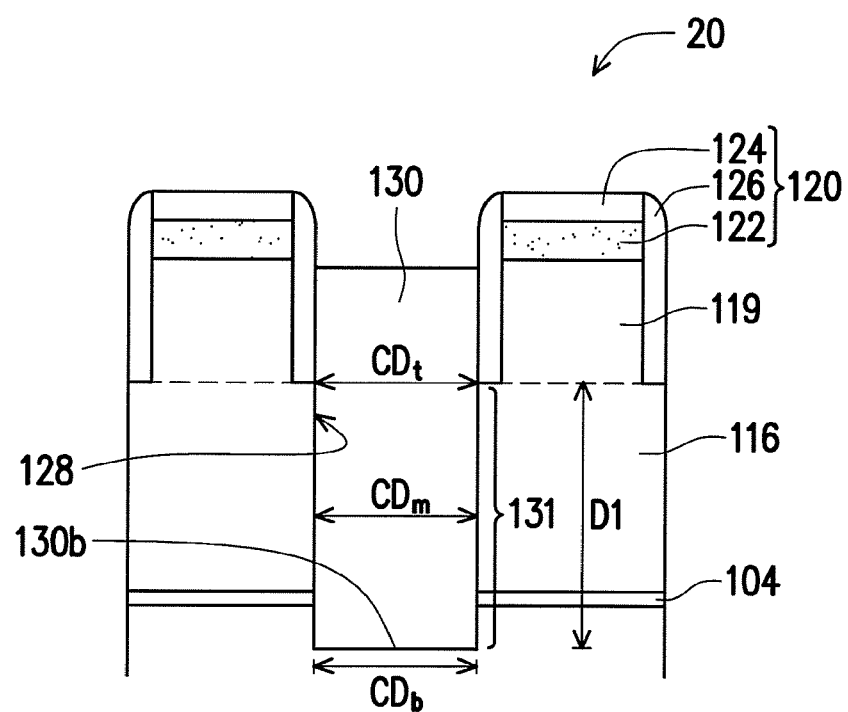

In one embodiment, as shown in FIG. 4E, the fin 116 not covered by the stack structure 120 is recessed through the stop layer 104. The etching of the fins 116 continues until penetrating through the stop layer 104, but the depth D1 of the recess 128 is smaller than the depth D (FIG. 2B) of the fins 116. The etching process for removing the fins 116 to form the recesses 128 includes at least a first etching process and a second etching process. In some embodiments, the first etching process includes a main anisotropic etching process, while the second etching process includes a tuning anisotropic etching process. In some embodiments, the fin 116 is etched through the main anisotropic etching process until the stop layer 104 is penetrated through and then is further etched through the tuning anisotropic etching process for tuning the profile. By adjusting the etching conditions and etching selectivity of the main anisotropic etching process and the tuning anisotropic etching process, the depth and the side profile of the resultant recess 128 are well controlled and the recess 128 has a substantially vertical profile. The top critical dimension CDt, the middle critical dimension CDm and the bottom critical dimension CDb of the resultant recess 128 are substantial equivalent. Later, the strained material portion 130 is formed in the recess 128 and fills up the recess 128. Regarding the base portion 131 of the strained material portion 130 below the top surface 114a of the insulators 114, the top dimension CDt of the base portion 131, the middle critical dimension CDm of the base portion 131 and the bottom critical dimension CDb of the base portion 131 of the strained material portion 130 are substantial equivalent. In some embodiments, the stop layer 104 embedded within the fins 116 is located above the bottom 130b of the strained material portion 130.

In the above embodiments, the stop layer 104 formed before the formation of the insulators 114 is inset within the fins 116. The stop layer 104 functions as an etching stop layer and the etching of the recesses 128 in the fins 116 may stop at the stop layer 104 or penetrates through the stop layer 104. During the recessing of the fins 116 between the stack structures 120, the etching and the profile of the recesses 128 can be well controlled due to the existence of the stop layer 104 in the fins 116. Also, for the region formed with dense fins (fins arranged with tight spacing), owing to the inset stop layer, the etching depth and spacing of the recesses can be tightly controlled. As the depth and the profile of the recesses are well controlled, the process window for forming the strained material portions are enlarged and the proximity profile of the later formed strained material portions 130 is kept stable.

In the above embodiments, as the stop layer 104 is used as the etching stop layer for forming the recesses, the depth and the profile of the resultant recesses 128 are accurately controlled and the proximity profile of the strained material portions 130 filled in the recesses 128 is kept stable, thus leading to uniform stress and uniform electrical performance of the device. Accordingly, the wafer analysis test (WAT) results and the uniformity performance of the device can be enhanced.

In some embodiments of the present disclosure, a fin-type field effect transistor comprising a substrate, a plurality of insulators, at least one gate stack and strained material portions is described. The substrate has a plurality of fins, and at least one of the plurality of fins comprises a stop layer embedded therein. The plurality of insulators is disposed on the substrate and between the plurality of fins. The at least one gate stack is disposed over the plurality of fins and disposed on the plurality of insulators. The strained material portions are disposed on two opposite sides of the at least one gate stack.

In some embodiments of the present disclosure, a fin-type field effect transistor comprising a substrate, insulators, at least one gate stack and strained material portions is described. The substrate has fins thereon and the fins comprise stop layers embedded therein. The insulators are disposed on the substrate and between the fins. The at least one gate stack is disposed across and over the fins and disposed on the insulators. The strained material portions are disposed on two opposite sides of the at least one gate stack. The strained material portions comprise source and drain regions and the stop layers in the fins are located above or are substantially leveled with bottoms of the strained material portions.

In some embodiments of the present disclosure, a method for forming a fin-type field effect transistor is described. A substrate embedded with a stop layer is provided. The substrate is patterned to form trenches in the substrate and fins between the trenches. Insulators are formed in the trenches of the substrate. A stack structure is formed over the substrate and on the insulators, and the stack structure covers portions of the fins. Recesses are formed in the fins by using the stop layer in the fins as an etching stop layer to remove portions of the fins that are not covered by the stack structure. Strained material portions are formed in the recesses between the insulators and on two opposite sides of the stack structure. After removing the stack structure, a gate stack is formed over the substrate and on the insulators. The strained material portions are located on two opposite sides of the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin-type field effect transistor, comprising:
a substrate having fins and insulators disposed between the fins, wherein at least one fin of the fins comprises a stop layer embedded within the at least one fin, and the stop layer is located below top surfaces of the insulators;
at least one gate stack, disposed on the fins and on the insulators; and
strained material portions, disposed on the at least one fin and disposed on two opposite sides of the at least one gate stack.

2. The transistor of claim 1, wherein a material of the stop layer comprises silicon germanium oxide (SiGeOx), silicon germanium (SiGe), silicon oxide (SiOx), silicon phosphide (SiP), silicon phosphate (SiPOx) or a combination thereof.

3. The transistor of claim 1, wherein portions of the strained material portions below the top surfaces of the insulators have vertical side profiles.

4. The transistor of claim 1, wherein portions of the strained material portions below the top surfaces of the insulators have a bottom critical dimension, a middle critical dimension larger than the bottom critical dimension, and a top critical dimension substantially equivalent to the middle critical dimension.

5. The transistor of claim 1, wherein portions of the strained material portions below the top surfaces of the insulators have a bottom critical dimension, a middle critical dimension smaller than the bottom critical dimension, and a top critical dimension smaller than the middle critical dimension.

6. The transistor of claim 1, wherein portions of the strained material portions below the top surfaces of the insulators have a bottom critical dimension, a middle critical dimension larger than the bottom critical dimension, and a top critical dimension smaller than the middle critical dimension.

7. The transistor of claim 1, wherein the stop layer is located within a first portion of the at least one fin that is covered by the at least one gate stack, and the strained material portions are in direct contact with second portions of the at least one fin that are not covered by the at least one gate stack without the stop layer located there-between.

8. A fin-type field effect transistor, comprising:
a substrate having fins thereon, wherein the fins comprise stop layers embedded within the fins respectively;
insulators, disposed on the substrate and between the fins;
at least one gate stack, disposed across the fins, covering the fins and disposed on the insulators; and
strained material portions, disposed on two opposite sides of the at least one gate stack, wherein the stop layers in the fins are separated by the strained material portions.

9. The transistor of claim 8, wherein a material of the stop layer comprises silicon germanium oxide (SiGeOx), silicon germanium (SiGe), silicon oxide (SiOx), silicon phosphide (SiP), silicon phosphate (SiPOx) or a combination thereof.

10. The transistor of claim 8, wherein portions of the strained material portions below top surfaces of the insulators have vertical side profiles.

11. The transistor of claim 8, wherein portions of the strained material portions below top surfaces of the insulators have a bottom critical dimension, a middle critical dimension larger than the bottom critical dimension, and a top critical dimension substantially equivalent to the middle critical dimension.

12. The transistor of claim 8, wherein portions of the strained material portions below top surfaces of the insulators have a bottom critical dimension, a middle critical dimension smaller than the bottom critical dimension, and a top critical dimension smaller than the middle critical dimension.

13. The transistor of claim 8, wherein portions of the strained material portions below top surfaces of the insulators have a bottom critical dimension, a middle critical dimension larger than the bottom critical dimension, and a top critical dimension smaller than the middle critical dimension.

14. A method for forming a fin-type field effect transistor, comprising:
  providing a substrate;
  forming a stop layer embedded within a first depth of the substrate;
  patterning the substrate to a second depth to form trenches in the substrate and fins between the trenches, wherein the second depth is larger than the first depth;
  forming insulators in the trenches of the substrate;
  forming a stack structure over the substrate and on the insulators, wherein the stack structure covers portions of the fins;
  forming recesses in the fins by using the stop layer in the fins as an etching stop layer to remove portions of the fins that are not covered by the stack structure;
  forming strained material portions in the recesses between the insulators and at two opposite sides of the stack structure;
  removing the stack structure; and
  forming a gate stack over the substrate, between the strained material portions and on the insulators, wherein the strained material portions are located at two opposite sides of the gate stack.

15. The method of claim 14, wherein forming a stop layer comprises performing ion implantation to form the stop layer embedded within the substrate.

16. The method of claim 14, wherein forming a stop layer comprises performing atomic layer deposition to form the stop layer and then forming a silicon layer on the stop layer.

17. The method of claim 14, wherein forming recesses in the fins by using the stop layer as an etching stop layer comprises performing at least one anisotropic etching process to remove portions of the fins that are not covered by the stack structure until at least the stop layer is removed, and the recesses in the fins have vertical side profiles.

18. The method of claim 14, wherein forming recesses in the fins by using the stop layer as an etching stop layer comprises performing an anisotropic etching process and then an isotropic etching process to remove portions of the fins that are not covered by the stack structure until at least the stop layer is removed.

19. The method of claim 14, wherein forming recesses in the fins by using the stop layer as an etching stop layer comprises performing a main etching process and then a lateral etching process to remove portions of the fins that are not covered by the stack structure until at least the stop layer is removed.

20. The method of claim 14, wherein forming recesses in the fins by using the stop layer as an etching stop layer comprises performing an isotropic etching process and then an anisotropic etching process to remove portions of the fins that are not covered by the stack structure until at least the stop layer is removed.

* * * * *